United States Patent
Zhang et al.

(10) Patent No.: US 8,976,614 B2
(45) Date of Patent: Mar. 10, 2015

(54) TRACKING SCHEME FOR MEMORY

(75) Inventors: Yong Zhang, Fremont, CA (US); Derek C. Tao, Fremont, CA (US); Dongsik Jeong, Fremont, CA (US); Young Suk Kim, Fremont, CA (US); Kuoyuan (Peter) Hsu, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 718 days.

(21) Appl. No.: 13/026,021

(22) Filed: Feb. 11, 2011

(65) Prior Publication Data

US 2012/0206983 A1   Aug. 16, 2012

(51) Int. Cl.
G11C 7/06      (2006.01)
G11C 7/22      (2006.01)
G11C 11/419    (2006.01)

(52) U.S. Cl.
CPC .............. G11C 7/227 (2013.01); G11C 11/419 (2013.01)
USPC .......................... 365/210.1; 365/194; 365/154

(58) Field of Classification Search
USPC ............ 365/154, 189.15, 189.05, 210.1, 194, 365/191
See application file for complete search history.

(56) References Cited

U.S. PATENT DOCUMENTS

| | | | | |
|---|---|---|---|---|
| 5,245,584 | A  * | 9/1993 | Zampaglione et al. | .. 365/230.06 |
| 5,627,789 | A  * | 5/1997 | Kalb, Jr. | ......................... 365/205 |
| 6,061,286 | A  * | 5/2000 | Baroni et al. | ................. 365/203 |
| 6,229,746 | B1 * | 5/2001 | Tooher | .......................... 365/194 |
| 6,556,472 | B2 * | 4/2003 | Yokozeki | ....................... 365/154 |
| 6,618,309 | B2 * | 9/2003 | DeMaris et al. | .............. 365/207 |
| 7,859,920 | B2 * | 12/2010 | Jung et al. | ................ 365/189.15 |
| 2002/0186579 | A1* | 12/2002 | Yokozeki | ....................... 365/154 |
| 2003/0206448 | A1* | 11/2003 | Sung et al. | ................ 365/189.07 |
| 2003/0231527 | A1* | 12/2003 | Nakase et al. | ................ 365/196 |
| 2008/0101143 | A1* | 5/2008 | Jung et al. | ................... 365/210.1 |
| 2009/0231934 | A1* | 9/2009 | Jung et al. | ................ 365/189.15 |
| 2012/0051160 | A1* | 3/2012 | Tao et al. | ....................... 365/191 |
| 2012/0134220 | A1* | 5/2012 | Kim et al. | ................. 365/189.11 |

\* cited by examiner

*Primary Examiner* — Douglas King

(74) *Attorney, Agent, or Firm* — Lowe Hauptman & Ham, LLP

(57) ABSTRACT

A memory has a tracking circuit for a read tracking operation. The memory includes a memory bit cell array, a tracking column, a tracking row, a sense amplifier row coupled to the memory bit cell array and the tracking row, and a sense amplifier enable logic. The memory further includes a tracking bit line coupled to the tracking column and the sense amplifier enable logic, and a tracking word line coupled to the tracking row and the sense amplifier enable logic. The tracking circuit is configured to track a column time delay along the tracking column before a row time delay along the tracking row.

16 Claims, 3 Drawing Sheets

TRACKING SCHEME FOR MEMORY

TECHNICAL FIELD

The present disclosure relates generally to an integrated circuit, and more generally to a memory.

BACKGROUND

A conventional tracking scheme in a memory, e.g., static random access memory (SRAM), has a tracking (reference) row and column placed at the bottom of a memory bit cell array. In a read tracking operation, the tracking scheme tracks the time delay along the memory array width (i.e., along a word line length), and not necessarily along the memory array height (i.e., along a bit line length).

Because of this tracking scheme, at the time when an input latch clock is reset by a tracking bit line for a new operation (i.e., to receive a new address for access in the memory), the read tracking operation may still be ongoing and not completed yet. This time delay margin issue will cause tracking function failure.

Also in the scheme known to the inventors, when a Sense Amplifier Enable (SAE) signal is triggered, it is driven from an instance center to the edge of the memory array. Thus, it takes more time for an edge sense amplifier to read data. Thus, there is extra time delay in the read tracking operation.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1:
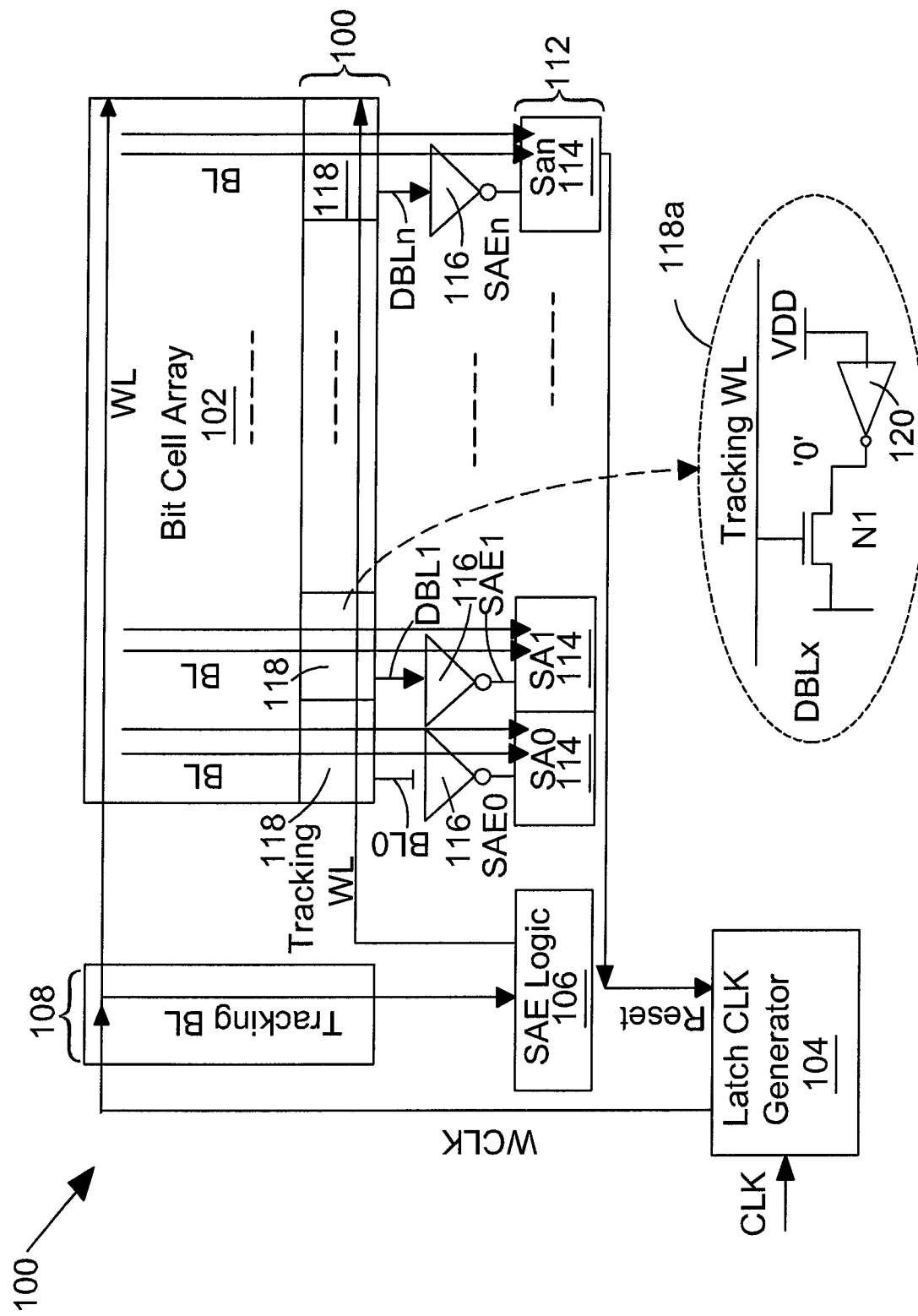
FIG. 1 is a schematic diagram showing an exemplary tracking scheme for a memory according to some embodiments.

FIG. 1 is a schematic diagram showing an exemplary tracking scheme for a memory according to some embodiments. The memory bit cell array 102 has word lines (WLs) and bit lines (BLs) coupled to bit cells. A latch clock generator 104 is coupled to a tracking BL passing along a tracking column 108. The latch clock generator 104 receives a clock signal (CLK) as an input. The tracking BL is coupled to the sense amplifier enable (SAE) logic 106. The SAE logic 106 is coupled to a tracking WL passing along a tracking row 110.

The tracking row 110 includes tracking bit cells 118. Each tracking bit cell has a bit cell structure coupled to a dummy bit line (DBL). For example, in one exemplary tracking bit cell 118a, an NMOS transistor N1 is coupled to a DBLx (where x is an integer number, e.g., 0, 1, 2, . . . , n), and a power supply voltage VDD is coupled to an inverter 120, which is coupled to the NMOS transistor N1.

Thus, the tracking bit cells 118 in the tracking row 110 (having the same structure as the tracking bit cell 118a) are programmed with tracking data '0' (logical 0). When the tracking WL is active, tracking data '0' is read onto DBLs of the tracking cells 118, which is then buffered by the inverters 116 to trigger (enable) sense amplifiers (SAs) 114 in a sense amplifier row 112 with sense amplifier enable signal SAEx (where x is an integer number, e.g., 0, 1, 2, . . . , n).

In this example, only one tracking row 110 and one sense amplifier row 112 are shown. However, there could be multiple tracking rows, each coupled to a respective sense amplifier row in some embodiments. Likewise, there could be multiple tracking columns in some embodiments.

From the tracking bit cells 118 in the tracking row 110, DBLs (DBL0, DBL1, . . . , and DBLn) are coupled to inverters 116, which are coupled to the SAx 114 (where x is an integer number, e.g., 0, 1, 2, . . . , n). And the last (farthest from the SAE logic 106) sense amplifier 114, i.e., SAn, is coupled to the latch clock generator 104. The tracking column 108 and the tracking row 110 are physically located above SAs 114.

Figure 2:
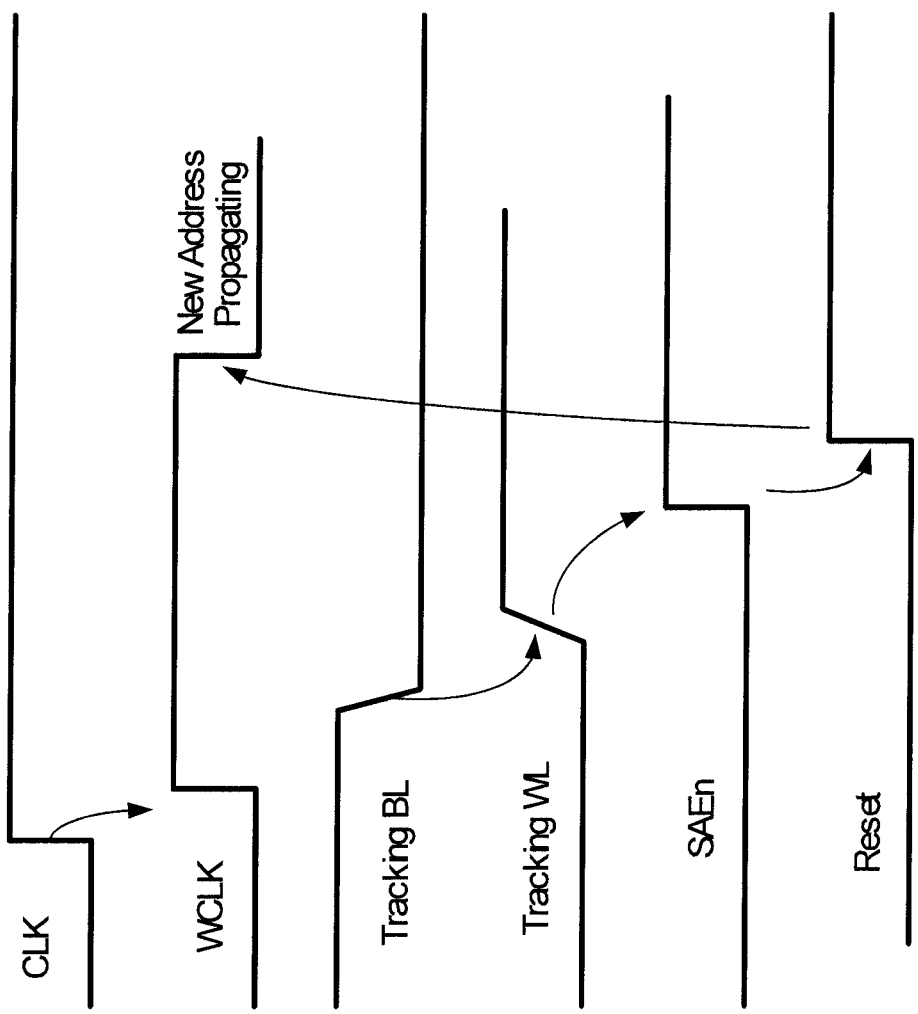
FIG. 2 is a plot showing waveforms of the exemplary tracking scheme in FIG. 1 according to some embodiments.

The functions of the tracking scheme in FIG. 1 are described below with references to FIG. 2. FIG. 2 is a plot showing waveforms of the exemplary tracking scheme in FIG. 1 according to some embodiments. A clock (CLK) signal, supplied to the latch clock generator 104, is asserted to a logical 1 as shown in the waveform CLK in FIG. 2. In response, the latch clock generator 104 generates a tracking clock WCLK signal that activates (i.e., pulls down to a logical 0 in this example) the tracking BL along the tracking column 108 from the top (farthest from the SAE logic 106). The WCLK also triggers (activates) the regular WLs in the memory bit cell array 102 for normal read operations.

The falling edge of the tracking BL received by the SAE logic 106 then triggers to activate (i.e., pull up to a logical 1 in this example) the tracking WL along the tracking row 110. The tracking BL along the tracking column 108 is active before the tracking WL along the tracking row 110, which provides the development time for the input signals of SAs 114.

When the tracking WL is asserted, all DBLs (DBL0, DBL, . . . , and DBLn) receive tracking data '0' (logical 0) from tracking bit cells 118, e.g., programmed by VDD and the inverter 120. The DBL signals are inverted to activate SAE0, SAE1, . . . , SAEn to a logical 1, which enable respectively coupled SAs. The SAs can now read (normal) data from BLs of the memory bit cell array 102.

When the last (i.e., farthest from the SAE logic 106) SAEn is activated (e.g., have a logical 1) for the SAn, tracking the read (reference) time delay of the memory bit cell array 102 is complete. The last SAEn triggers a Reset signal from SAn to reset the latch clock generator 104 for normal operation of the memory bit cell array 102, e.g., receiving new memory bit cell addresses. The read time delay is from the initial active WCLK to the time of enabling SAEn in one embodiment.

Because the tracking scheme in FIG. 1 tracks the column time delay of tracking BL along the tracking column 108 and then tracks the row time delay of tracking WL along tracking row 110, the SAE signals are activated to enable SAs as the normal BL read data are available for the SAs. The tracking route (along tracking BL and tracking WL) closely follows the normal BL and WL route for a normal read operation in length, timing, and local process, voltage, and temperature (PVT) variations.

By allowing the (read) tracking operation to be finished fully, e.g., before receiving new addresses, the tracking scheme in FIG. 1 improves the consistency of memory read margin across all SAs. The reference (tracking) time delay fully tracks the memory read operation time delay because WCLK falling is triggered after the last SAEn activation. Hence the memory read access time can be reduced by preventing an improper tracking operation that would result in errant reading of memory bit cells.

Also, there is no extra delay from having both the tracking WL delay and a separate sense amplifier enable signal delay, because they are combined together. The tracking WL propagates along the tracking bit cells 118 in the tracking row 110, at the same time allowing DBLx to trigger SAEx and enable SAx (where x is an integer number). SAEx is provided through the inverter 116 from the tracking data of the tracking bit cell 118. Because the tracking bit cells 118 have similar structures and similar local PVT variations as the other (normal) bit cells, the tracking operation more accurately reflects PVT effects on the memory bit cell array 102.

Figure 3:
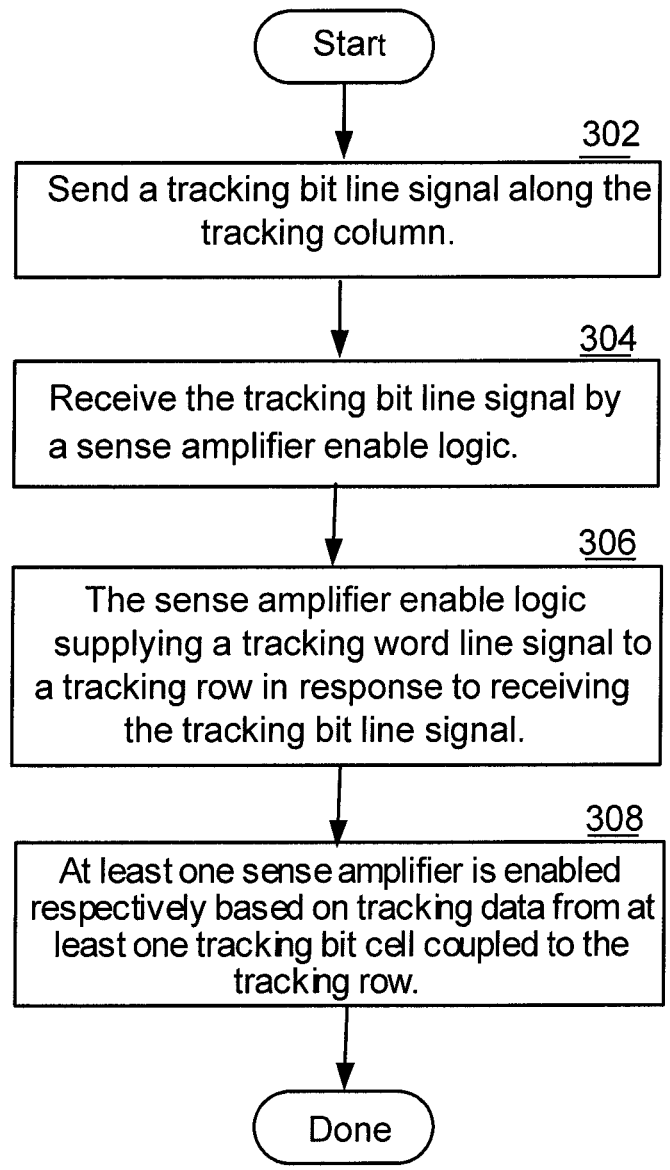
FIG. 3 is a flowchart of a method for the exemplary tracking scheme for a memory in FIG. 1 according to some embodiments.

FIG. 3 is a flowchart of a method for the exemplary tracking scheme of a memory in FIG. 1 according to some embodiments. At step 302, a tracking bit line signal is sent along the tracking column. At step 304, the tracking bit line signal is received by a sense amplifier enable logic. At step 306, the sense amplifier enable logic supplies a tracking word line signal to a tracking row in response to receiving the tracking bit line signal. At step 308, at least one sense amplifier is enabled respectively, based on tracking data from at least one tracking bit cell coupled to the tracking row.

In various embodiments, a clock signal is supplied to the latch clock generator. A latch clock generator supplies a tracking clock signal to a tracking column. Tracking data, e.g., a logical 0, is supplied from at least one tracking bit cell in the tracking row to at least one dummy bit line respectively. A reset signal is supplied to the latch clock generator after a sense amplifier farthest from the sense amplifier enable logic is enabled. A new address for access in the memory is received. Tracking data from the at least one tracking bit cell is supplied to at least one buffer coupled to the at least one sense amplifier respectively.

In some embodiments, a memory has a tracking circuit for a read tracking operation. The memory includes a memory bit cell array, a tracking column, a tracking row, a sense amplifier row coupled to the memory bit cell array and the tracking row, and a sense amplifier enable logic. The memory further includes a tracking bit line coupled to the tracking column and the sense amplifier enable logic, and a tracking word line coupled to the tracking row and the sense amplifier enable logic. The tracking circuit is configured to track a column time delay along the tracking column before a row time delay along the tracking row.

In some embodiments, a method of tracking a memory includes sending a tracking bit line signal along the tracking column. The tracking bit line signal is received by a sense amplifier enable logic. The sense amplifier enable logic supplies a tracking word line signal to a tracking row in response to receiving the tracking bit line signal. At least one sense amplifier is enabled respectively, based on tracking data from at least one tracking bit cell coupled to the tracking row.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

What is claimed is:

1. A memory having a tracking circuit for a read tracking operation, comprising:
   a memory bit cell array;
   a tracking column;
   a tracking row;
   a sense amplifier row coupled to the memory bit cell array and the tracking row;
   a sense amplifier enable logic;
   a tracking bit line coupled to the tracking column and the sense amplifier enable logic;
   a tracking word line coupled to the tracking row and the sense amplifier enable logic,
   wherein the tracking circuit is configured to track a column time delay along the tracking column before a row time delay along the tracking row, and the sense amplifier enable logic is configured to receive an output from the tracking column along the tracking bit line and to activate the tracking word line in response to the received output; and
   a latch clock generator coupled to the tracking bit line, the latch clock generator configured to supply a tracking clock signal, in the sense amplifier row, a sense amplifier in the sense amplifier row farthest from the sense amplifier enable logic being configured to generate a reset signal for the latch clock generator.

2. The memory of claim 1, wherein the tracking row comprises at least one tracking bit cell and the at least one tracking bit cell is configured to supply tracking data for the read tracking operation.

3. The memory of claim 2, wherein the at least one tracking bit cell is coupled to at least one dummy bit line and at least one buffer.

4. The memory of claim 3, wherein the at least one buffer is coupled to at least one sense amplifier in the sense amplifier row.

5. The memory of claim 2, wherein the at least one tracking bit cell is configured to read a logical 0 when the tracking word line is asserted during the read tracking operation.

6. The memory of claim 2, wherein each tracking bit cell comprises an NMOS transistor.

7. The memory of claim 1, wherein the tracking bit line is arranged to be activated before the tracking word line is activated.

8. The memory of claim 1, wherein the sense amplifier enable logic is directly connected to the tracking word line.

9. The memory of claim 1, wherein the memory bit cell array comprises at least one bit line, the tracking row is connected to at least one tracking bit cell, and the at least one tracking bit cell is not connected to the at least one bit line.

10. A method of tracking a memory, comprising:
sending a tracking bit line signal along a tracking column;
receiving the tracking bit line signal by a sense amplifier enable logic;
the sense amplifier enable logic supplying a tracking word line signal to a tracking row in response to receiving the tracking bit line signal;
enabling at least one sense amplifier based on tracking data from at least one tracking bit cell coupled to the tracking row; and
supplying the tracking data from the at least one tracking bit cell to at least one buffer coupled to the at least one sense amplifier.

11. The method of claim 10, further comprising a latch clock generator supplying a tracking clock signal to a tracking column.

12. The method of claim 10, further comprising supplying tracking data from at least one tracking bit cell in the tracking row to at least one dummy bit line.

13. The method of claim 12, wherein the tracking data supplied is a logical 0.

14. The method of claim 10, further comprising supplying a clock signal to a latch clock generator.

15. The method of claim 10, further comprising supplying a reset signal to a latch clock generator after a sense amplifier of the at least one sense amplifier, which is a sense amplifier farthest from the sense amplifier enable logic, is enabled.

16. The method of claim 10, further comprising receiving a new address for access in the memory.

\* \* \* \* \*